(12) United States Patent
Shirasaki et al.

(10) Patent No.: US 8,383,297 B2
(45) Date of Patent: Feb. 26, 2013

(54) PELLICLE FOR LITHOGRAPHY AND METHOD FOR MANUFACTURING PELLICLE FILM

(75) Inventors: Toru Shirasaki, Annaka (JP); Kunihiro Ito, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 194 days.

(21) Appl. No.: 13/032,186

(22) Filed: Feb. 22, 2011

(65) Prior Publication Data
US 2011/0207030 A1 Aug. 25, 2011

(30) Foreign Application Priority Data

Feb. 23, 2010 (JP) ................................. 2010-037408

(51) Int. Cl.
*G03F 1/62* (2012.01)
(52) U.S. Cl. .......................................................... 430/5
(58) Field of Classification Search ......... 430/5; 428/14
See application file for complete search history.

(56) References Cited

U.S. PATENT DOCUMENTS

2003/0192567 A1  10/2003  Koizumi et al.
2008/0213679 A1*  9/2008  Miyakawa et al. ............... 430/5

FOREIGN PATENT DOCUMENTS

JP   A-2003-302745   10/2003

* cited by examiner

*Primary Examiner* — Stephen Rosasco
(74) *Attorney, Agent, or Firm* — Oliff & Berridge, PLC

(57) ABSTRACT

Provided are a pellicle for lithography which can prevent a haze from being generated on a photomask even if a short wave length laser such as an ArF excimer laser is used for a long period of time, and a method for producing a pellicle film to be attached to the pellicle for lithography. The pellicle 1 for lithography is comprised of a frame-like pellicle frame 4 having one open frame on one side of the pellicle frame and another open frame on another side of the pellicle frame; and a laser beam transmissive pellicle film 2 for lithography, which is attached to the one side of the pellicle frame. The another open frame is capable of attaching to a photomask 10 and the pellicle film has a venting hole 7 having a hole size through which a gas molecule 15 can pass but not a foreign particle 16.

8 Claims, 3 Drawing Sheets

PELLICLE FOR LITHOGRAPHY AND METHOD FOR MANUFACTURING PELLICLE FILM

TECHNICAL FIELD

The present invention relates to a pellicle for lithography, which is attached to a photomask for lithography used in manufacturing a semiconductor integrated circuit or a liquid crystal display panel etc. to prevent foreign materials from adhering to the photomask, and to a method for manufacturing a pellicle film.

BACKGROUND OF THE INVENTION

A minute circuit pattern of the semiconductor integrated circuit or the liquid crystal display panel is formed using lithographic technology in which the circuit pattern is irradiated with a laser beam through a photomask and transferred onto a semiconductor wafer or liquid crystal original plate.

Formation of the circuit pattern using this lithographic technology is usually carried out in a clean room, but even in the clean room there are minute foreign particles such as dust. If the foreign particle adheres to the photomask, the particle causes reflection, shading and scattering of light, and therefore deformation and disconnection of the circuit pattern occur. In addition, edges of the circuit pattern become rough, and the ground of the semiconductor wafer or the like may be soiled. Accordingly, in order to prevent the foreign particles from adhering to the photomask, the pellicle for lithography is usually attached to the photomask.

The pellicle for lithography (hereinafter called pellicle) is comprised of a pellicle frame and a pellicle film attached to the pellicle frame. When the pellicle frame is attached to the surface of the photomask, a mask pattern region of the photomask is covered with the pellicle, and adhesion of the foreign particles can be prevented. When the foreign particles adhere to the pellicle film, the foreign particles on the pellicle film do not affect the transfer if the laser beam is focused on the mask pattern of the photomask.

In the case where the pellicle-attached photomask is used for a long period of time, a haze (growable foreign material) may be gradually generated on a mask pattern covered with the pellicle. This phenomenon occurs through photochemical reactions between gases such as organic gases, ionic gases, etc. existing in an enclosed pellicle space surrounded by a pellicle frame, pellicle film, photomask etc.

These gases existing in the enclosed pellicle space are emitted from organic materials of the pellicle and/or ion residues of the photomask. On the other hand, at the time the laser beam passes through the photomask, light scattering may occur at an edge of the mask pattern, and the pellicle frame could be decomposed through light degradation under this scattered light, thereby gases are generated in the enclosed pellicle space.

These days, circuit patterns of semiconductor integrated circuits etc. are becoming miniaturized and a shorter wavelength laser beam such as an ArF excimer laser beam (193 nm) etc. are used for the formation of the circuit patterns. Such shorter wave laser beams have high energy so that the beam tends to trigger photo reactions with these gases to cause problems such as generation of the haze.

In order to solve such problems, as shown in JP 2003-302745A, the haze on the mask pattern can be decomposed when the haze is irradiated with a laser beam over the pellicle film with the laser beam. However, even if the haze is decomposed, gases are eventually generated and remains within the enclosed pellicle space so that another haze is generated again through photochemical reactions under the laser beam.

SUMMARY OF THE INVENTION

The present invention was made to solve the problems described above and an object of the present invention is to provide a pellicle for lithography which can prevent a haze from generating on a photomask even if a short-wave laser beam such as an ArF excimer laser beam is used for a long period of time. Another object of the present invention is to provide a method for manufacturing a pellicle film to be attached to the pellicle for lithography.

A pellicle for lithography, which is made to achieve the objects described above, is characterized in that the pellicle for lithography comprises:

a frame-like pellicle frame having a central opening and one frame face on one side of the pellicle frame and another open frame on the other side of the pellicle frame; and a laser beam transmissive pellicle film for lithography, which is attached to the one side of the pellicle frame faces, wherein the other open frame face is capable of attaching to a photomask, and the pellicle film has a venting hole having a hole size through which a gas can pass but not a solid particle.

The photomask (a high definition photomask called "reticle" is also included in the photomask) means an exposure original plate used for lithography.

The pellicle for lithography is characterized in that the said venting hole has a hole size of up to 0.1 μm in diameter.

The pellicle for lithography is characterized in that the said pellicle film has a hole density (total hole area or total area of said venting holes) in a range of 0.01 mm$^2$-0.5 mm$^2$ per 1 mm$^2$ of a gas passage region in which said venting holes are formed The pellicle for lithography is characterized in that the said pellicle film has a plurality of the said venting holes all over a laser beam transmissive region through which the said laser beam passes.

The pellicle for lithography is characterized in that the said pellicle film has a plurality of the said venting holes in a frame side region of the said laser beam transmissive region, the frame side region being formed along an inside wall of the said pellicle frame.

The pellicle for lithography is characterized in that the said frame side region is formed within 20 mm from the inside wall of the said pellicle frame.

The pellicle of lithography is characterized in that the said flame side region does not oppose to a mask pattern region on the said photomask.

A method for manufacturing a pellicle film having a venting hole through which a gas passes but not a solid particle, comprising the steps of:

preparing a film-forming substrate having a surface on which a convex portion that fits into the venting hole is provided;

dropping a solution of a pellicle film composition, comprising a pellicle film material and a volatile solvent, on a central portion of the film-forming substrate;

rotating the film-forming substrate so as to apply, under a centrifugal force, the solution all over the surface of the film-forming substrate to have a thickness of the same dimension as that of the height of the convex portion;

evaporating the volatile solvent to form the pellicle film; and removing the pellicle film from the film-forming substrate.

According to the pellicle for lithography of the present invention, due to a pellicle film having a venting hole which allows a gas to pass but not a foreign particle, a gas generated in an enclosed pellicle space is discharged outside through the venting hole. Therefore, the gas doesn't remain in the enclosed pellicle space so that a photochemical reaction under the laser beam does not occur. Thus, even if a short wave length laser beam such as a ArF excimer laser beam is used for a long period of time, generation of a haze on a photomask can be securely prevented. In addition, the foreign particle cannot enter into the enclosed pellicle space from outside through the venting hole so that adherence of the foreign particle to the photomask can be prevented.

According to the pellicle for lithography of the present invention, the venting hole is made into a diameter of up to 0.1 μm so that the venting hole prevents a minute foreign material from entering into the enclosed pellicle space, and also the gas generated in the enclosed pellicle space can be discharged.

According to the pellicle for lithography of the present invention, the total hole area of 0.01 mm$^2$-0.5 mm$^2$ per 1 mm$^2$ of the gas passage region is formed in the gas passage region within which the venting holes are formed, so that the gases can be discharged outside much faster.

According to the pellicle for lithography of the present invention, the pellicle film has the venting holes distributed all over the transmissive region, so that venting holes exist near the gases which are generated and diffused in the enclosed pellicle space. This results in realizing a faster discharge of the gases to the outside.

According to the pellicle for lithography of the present invention, the pellicle film has the venting holes distributed all over the transmissive region, so that venting holes exist near the gases which are generated and diffused in the enclosed pellicle space. This results in realizing a faster discharge of the gases to the outside.

According to the pellicle for lithography of the present invention, the pellicle film has the venting holes in the frame side region of the said transmissive region. The frame side region is formed along an inside wall of the said pellicle frame, so that at a time of lithographing, the laser beam which is scattered at an edge and an inner wall of the venting hole hardly affects the whole area of the semiconductor wafer. Therefore, a circuit pattern can be transferred at a high-quality level.

According to the pellicle for lithography of the present invention, the venting holes are formed in a frame side region within 20 mm from an inner edge of the open frame or in a region which does not oppose to a mask pattern region on the said photomask, so that an effect of the laser beam that is scattered by the venting hole can be made small. The circuit pattern can be transferred with a high-quality level.

According to the method for producing the pellicle film, film formation is carried out by a spin coating method using a film-forming substrate having a convex portion whose size fits into the venting hole. A minute venting hole can be formed highly precisely and easily.

DESCRIPTION OF CODES

Figure 1:
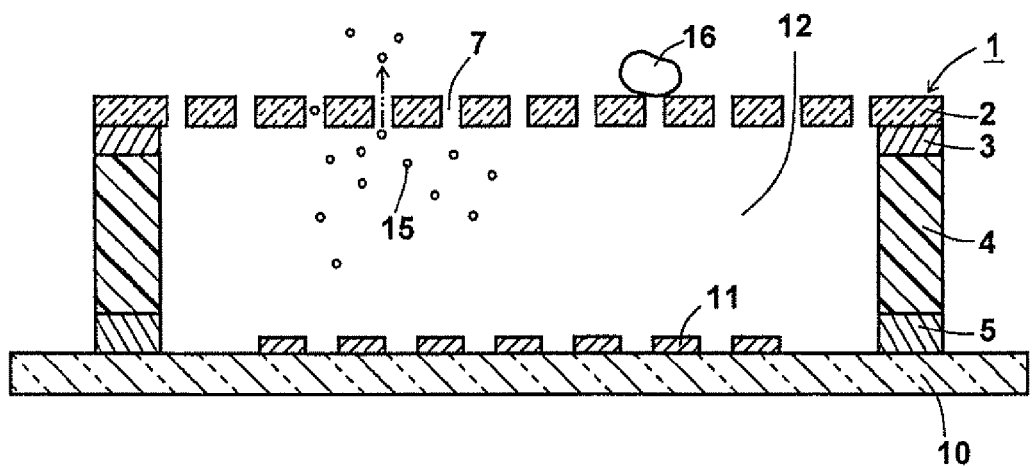
FIG. 1 is a schematic cross-sectional view showing a pellicle for lithography in use of the present invention.

Codes mean as follows. 1 and 1*a*: Pellicle for lithography, 2 and 2*a*: Pellicle film, 3: Adhesive layer, 4: Pellicle frame, 5: Pressure-sensitive adhesion layer, 7: venting hole, 10: Photomask, 11: Mask pattern, 12: Enclosed pellicle space, 13: Mask pattern region, 15: Gas molecule, 16: Foreign material, 20: Film forming substrate, 21: Convex portion, 22: Solution of pellicle film composition, 25: Nozzle, 30: Substrate material, 31 and 31*a*: Resist film, 35: Photomask, 37: Mask pattern, d: Distance, L: Exposure light The present invention will be explained below in detail, but the present invention is not limited thereto.

The structure of a pellicle for lithography of the present invention will be explained with reference to FIG. 1. A pellicle 1 for lithography has a pellicle frame 4 having a central opening and an upper frame face on one side of the pellicle 4 (the upper side in FIG. 1) on one side of the pellicle frame 4; and a pellicle film 2 through which an ArF excimer laser beam for lithography passes is attached to the upper frame face via an adhesive layer 3. The pellicle 1 has a pressure-sensitive adhesion layer 5 which is applied on the other frame face (the lower side in FIG. 1) of the pellicle frame 4 and thus can be attached to a photomask 10.

The pellicle frame 4 is formed into, for example, a quadrangle-like frame having a size capable of surrounding a mask pattern region in which a mask pattern 11 is formed on the photomask 10. In this example, the outer shape of the pellicle film 2 is formed into a quadrangle shape to meet the frame-like shape of the pellicle frame 4.

This pellicle film 2 has many venting holes 7 penetrating through the film. A gas passage region of the pellicle film 2, within which the venting holes 7 are formed, can be formed at any place as long as the gas passage region resides within the central opening of the pellicle frame 4 or, in other words, within a laser beam transmissive region. Here, in one example, the venting holes 7 are formed all over the laser beam transmissive region. In addition, the venting holes 7 are not forbidden to be formed at a portion where the adhesive layer 3 is attached to the pellicle film 2, but the venting holes 7 in this portion are sealed by the adhesive layer 3 and accordingly these venting holes fail to function as venting holes.

The venting holes 7 are each formed to have a hole size through which a foreign particle 16 cannot pass. The size of the foreign particle 16 that cannot pass through the hole is a size that causes a trouble in a lithography process when the foreign particles 16 adhere to the photomask 10. In other words, the hole size of the venting holes 7 is formed into one that stops the foreign particle 16 that causes a trouble during the lithography process. Specifically, the hole size of the venting hole 7 is determined as follows. When, for example, the foreign particles 16 that contain the smallest particle size of 0.3 μm are used as a standard substance in determining whether there is a foreign particle or not, the size of each venting hole 7 is preferably set to have a diameter of up to 0.1 μm so as to securely prevent the foreign particle with the size of 0.3 μm passing through the hole.

Furthermore, each venting hole 7 is formed into a hole size capable of discharging a gas molecule 15 of a gas generated within an enclosed pellicle space 12 enclosed by the pellicle film 2, the pellicle frame 4 and the photomask 10. The molecular size of the gas molecule 15 is far smaller than 0.1 μm in diameter, for example, less than 1 nm, so that the venting hole 7 is formed into a gas passable hole having a hole size of, for example, more than 0.05 μm in diameter. If the foreign particle 16 does not pass through, the venting hole 7 should preferably have a hole size as large as possible to allow the gas molecule 15 to easily pass through the hole and to be easily discharged.

The venting hole 7 may be formed into a round or quadrangle shape.

As for a material of the pellicle film 2, there is no particular limitation on the kind of the material, as long as the material has high laser beam transmissibility and chemical stability, any publicly known material can be used. For example, fluoropolymer, nitrocellulose, cellulose acetate, etc. can be exemplified as the material for the pellicle film 2. More specifically, amorphous fluoropolymers such as Cytop (Trade name, produced by Asahi Glass Co., Ltd., a registered Trade mark), Teflon AF (Trade name, produced by DuPont: Teflon is a registered Trade mark), etc. can be exemplified.

There is no particular limitation on the material for the pellicle frame 4, various publicly known materials can be used as long as necessary physical strength can be obtained. For example, aluminum alloy is light in weight and strong in required physical properties, so that it can be preferably used as a material for pellicle frame 4.

As for adhesive for the adhesive layer 3, there is no particular limitation, various publicly known materials can be used. For example, acrylic resin type adhesives, epoxy resin type adhesives, silicone resin type adhesives, fluororesin type adhesives, etc. can be exemplified as the adhesive for the adhesive layer 3. Further, as the adhesive layer 3, a double-stick tape may be used. If the pellicle film 2 itself can be attached (adhered) to the pellicle frame 4, the adhesive layer 3 can be omitted.

As for a pressure-sensitive adhesion agent for the pressure-sensitive adhesion layer 5, there is no particular limitation, any publicly known materials can be used. For example, silicone resin type pressure-sensitive adhesion agents, acrylic resin type pressure-sensitive adhesion agents, polybutene resin type pressure-sensitive adhesion agents, etc. can be exemplified as the pressure-sensitive adhesion agent for the pressure-sensitive adhesion layer 5. Further, as the pressure-sensitive adhesion layer 5, double-stick tape may be used. To the pressure-sensitive adhesion layer 5, releasable protective paper (liner) may be attached. Furthermore, the pressure-sensitive adhesion layer 5 on the pellicle frame 4 may be omitted, for example, if the pellicle 1 itself can be attached to the photomask 10 by applying the pressure-sensitive adhesion layer on the photomask 10.

The pellicle 1 of the present invention is used as follows.

The pellicle 1 is used as shown in FIG. 1. The pellicle frame 4 is attached to photomask 10 through the pressure-sensitive adhesion layer 5 so as to cover the mask pattern 11. The gas molecule 15 generated in the enclosed pellicle space 12 is diffused and is discharged from the enclosed pellicle space 12 to the outside through the venting holes 7 because the gas molecule 15 is smaller in size than that of the venting hole 7 of the pellicle film 2. Thus, the gas that could cause the generation of the haze does not remain in the enclosed pellicle space 12, and accordingly haze generation on the photomask 10 can be prevented. On the other hand, the foreign particle 16 having a size large enough to possibly cause problems at a lithography process is prevented from entering into the enclosed pellicle space 12 from the outside because the size of particle 16 is larger than that of the venting hole 7.

As shown in FIG. 1, in the case where the venting holes 7 are formed all over the surface of the laser beam transmissive region of the pellicle film 2, whole surface thereof becomes a venting region so that every gas molecule 15 generated and dispersed in the enclosed pellicle space 12 can be positioned near a venting hole 7, accordingly each gas molecule can be preferably discharged outside quickly through its nearest venting hole 7.

The more the number of the venting holes 7 in the pellicle film 2 is increased, the more the venting ability is improved, and the gas molecule 15 can be quickly discharged outside.

For example, when the venting hole 7 is formed into a size of up to 0.1 μm in diameter, the venting holes 7 should be preferably formed to have a hole density (total hole area) in the range of 0.01 mm$^2$-0.5 mm$^2$ per 1 mm$^2$ of the pellicle film 2.

Figure 2:
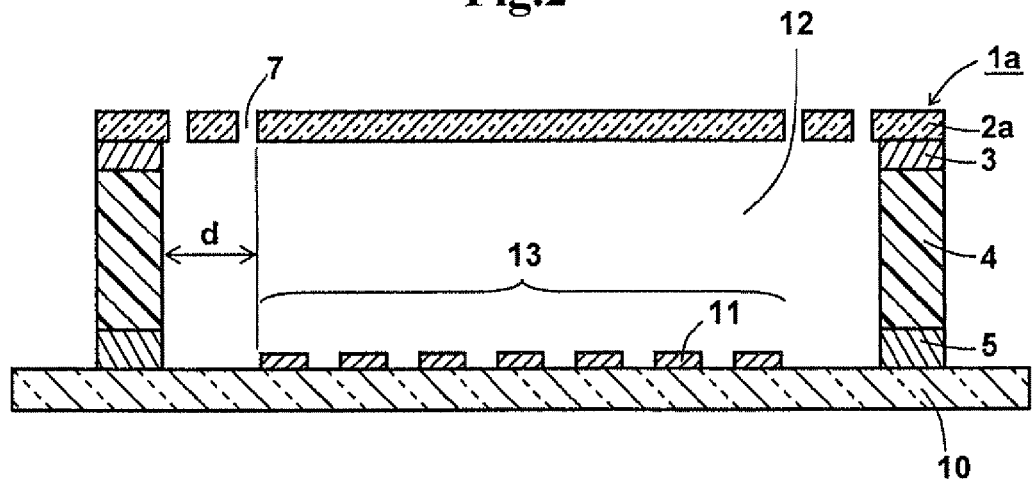
FIG. 2 is a schematic cross-sectional view showing another pellicle for lithography in use of the present invention

During the lithography process, there is a possibility that the laser beam scatters at an edge and inner wall of the venting hole 7, therefore as shown in FIG. 2, the venting holes 7 may be formed only in a frame-side region of the pellicle film 2 along the inside wall of the pellicle frame 4.

As shown in FIG. 2, a pellicle 1a has a pellicle film 2a having the venting holes 7 formed in the frame-side region which is positioned in the laser beam transmissive region and is defined by the inside wall of the pellicle frame 4 and a distance d from the inside, wall. The similar components previously illustrated are denoted with the same codes, and detailed explanation thereon will be omitted.

When the distance d that defines the range of this frame-side region is, for example, 20 mm, more preferable 10 mm, a scattered laser beam (scattering beam) scattered by the venting holes 7 hardly reaches a semiconductor wafer (not shown) or a liquid crystal original plate so that effects of the scattered beam on the semiconductor wafer etc. become small, being preferable.

Further, when the range of the distance d does not oppose to a mask pattern region 13 on a photomask 10, effects of the scattered beam against a circuit pattern (not shown) formed on the semiconductor wafer etc., become small, being preferable.

This frame side region is a gas venting region through which the gas is discharged from the enclosed pellicle space 12 to the outside. The venting hole 7 is preferably formed into said hole size and said hole density.

As described above, the amount of time needed to discharge the gas in the case where the venting holes 7 are formed only in the frame side region of the pellicle film 2a, is longer than that in the case where the venting holes 7 are formed all over the surface of the pellicle film 2, but scattering of the laser beam at the venting holes 7 can be made preferably small.

Figure 3:
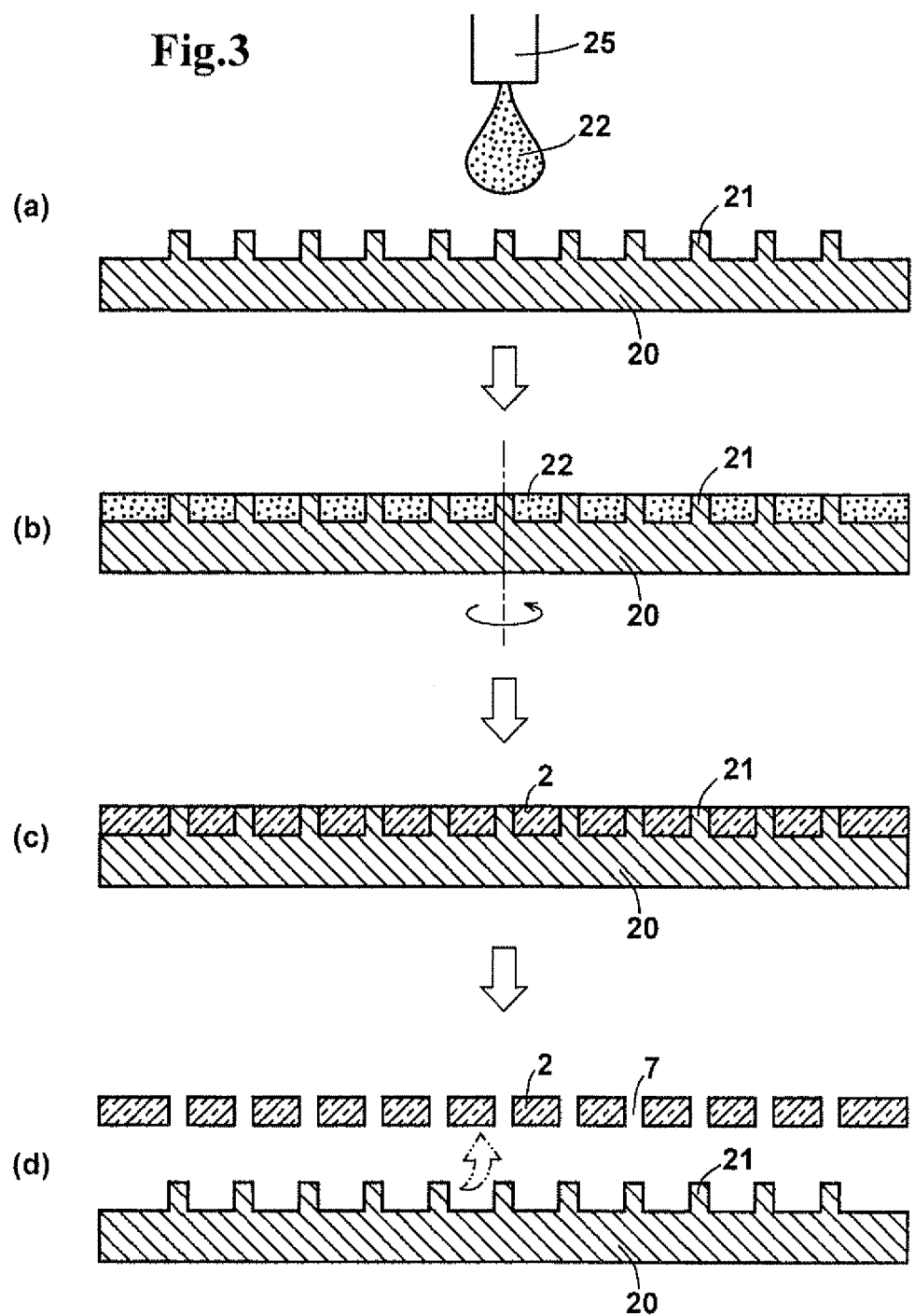
FIG. 3 is a schematic view showing a process for producing a pellicle film of the present invention.

Next the method for producing the pellicle film will be explained below with reference to FIG. 3.

The present invention is characterized in that the pellicle film 2 is produced by a spin-coating method using a film-forming substrate 20 shown in FIG. 3(a). The film-forming substrate 20 has convex portions 21 all over the surface (upper side in the Figure). This convex portions 21 are each formed to be a size just tightly fitting to the venting through hole 7 through which the gas molecule 15 can pass but not a foreign particle. Further the convex portions 21 are each formed at a position corresponding to the venting hole 7 of the pellicle film 2 to be formed on the film-forming substrate 20. The height of the convex 21 is formed to have approximately the same dimension as that of the film thickness of the pellicle film 2 to be formed.

The present invention is characterized in that the pellicle film 2 is produced by a spin-coating method using a film-forming substrate 20 shown in FIG. 3(a). The film-forming substrate 20 has convex portions 21 all over the surface (upper side in the Figure). This convex portions 21 are each formed to be a size just tightly fitting to the venting through hole 7 through which the gas molecule 15 can pass but not a foreign particle. Further the convex portions 21 are each formed at a position corresponding to the venting hole 7 of the pellicle film 2 to be formed on the film-forming substrate 20. The height of the convex 21 is formed to have approximately the same dimension as that of the film thickness of the pellicle film 2 to be formed.

The film-forming substrate 20 is fixed on a publicly known spin-coating device (not shown). As shown in the same Figure, on the central portion of the surface (upper side of the Figure) of the film-forming substrate 20, a previously-prepared solution 22 of a pellicle film composition comprising a pellicle film material and volatile solvent is dropped from a nozzle 25. As for the kind of volatile solvent, a publicly known solvent suitable for the pellicle film material is used. For example, in the case where said amorphous fluoro polymer is used as the pellicle film material, fluorinated solvent is used as the volatile solvent. In addition, the concentration of the solution 22 is adjusted to a concentration of that of a solution used in a publicly known pellicle film producing process.

Then, as shown in FIG. 3(b), the film-forming substrate 20 is rotated to apply the solution 22 on the entire surface of the film-forming substrate 20 to have a thickness of the same dimension as that of the height of the convex portion 21 so as to fill spaces between the convex portions 21 and 21. At this moment, an excess amount of the solution 22 is flung away centrifugally.

Next, the volatile solvent of the solution 22 is evaporated and the film-forming substrate 20 is dried by a hot plate or heating oven, or dried under a reduced pressure. As shown in FIG. 3(c), thus the pellicle film is formed. The venting holes 7 (see FIG. 3(d)) are thus formed in a shape and at positions corresponding to the convex portions 21.

Finally, as shown in FIG. 3(d), the pellicle film 2 is peeled off from the film-forming substrate 20 to get the pellicle film 2 having the venting holes 7.

Thus the pellicle film 2 having the minute venting holes 7 can be produced easily and accurately using the film-forming substrate 20 having the convex portions 21.

The pellicle film 2 may be shaped to have an outer shape larger than that of the frame shape and may be attached to the pellicle frame 4 (see FIG. 1), and then a protruding portion of the pellicle film beyond the contour of the pellicle frame may be cut off to thereby adjust the outer shape of the film into the frame shape. Alternatively, the pellicle film 2 may be shaped into the same outer shape as that of the pellicle frame and then the shaped pellicle film may be attached to the pellicle frame 4. Still on the other hand, the pellicle film 2 may be directly produced to have the same outer shape as that of the pellicle frame 4 and then the film may be attached as it is to the frame.

The film-forming substrate 20 used for producing the pellicle film mentioned above can be produced, for example, using a process shown in FIGS. 4(a) to 4(e).

Figure 4:
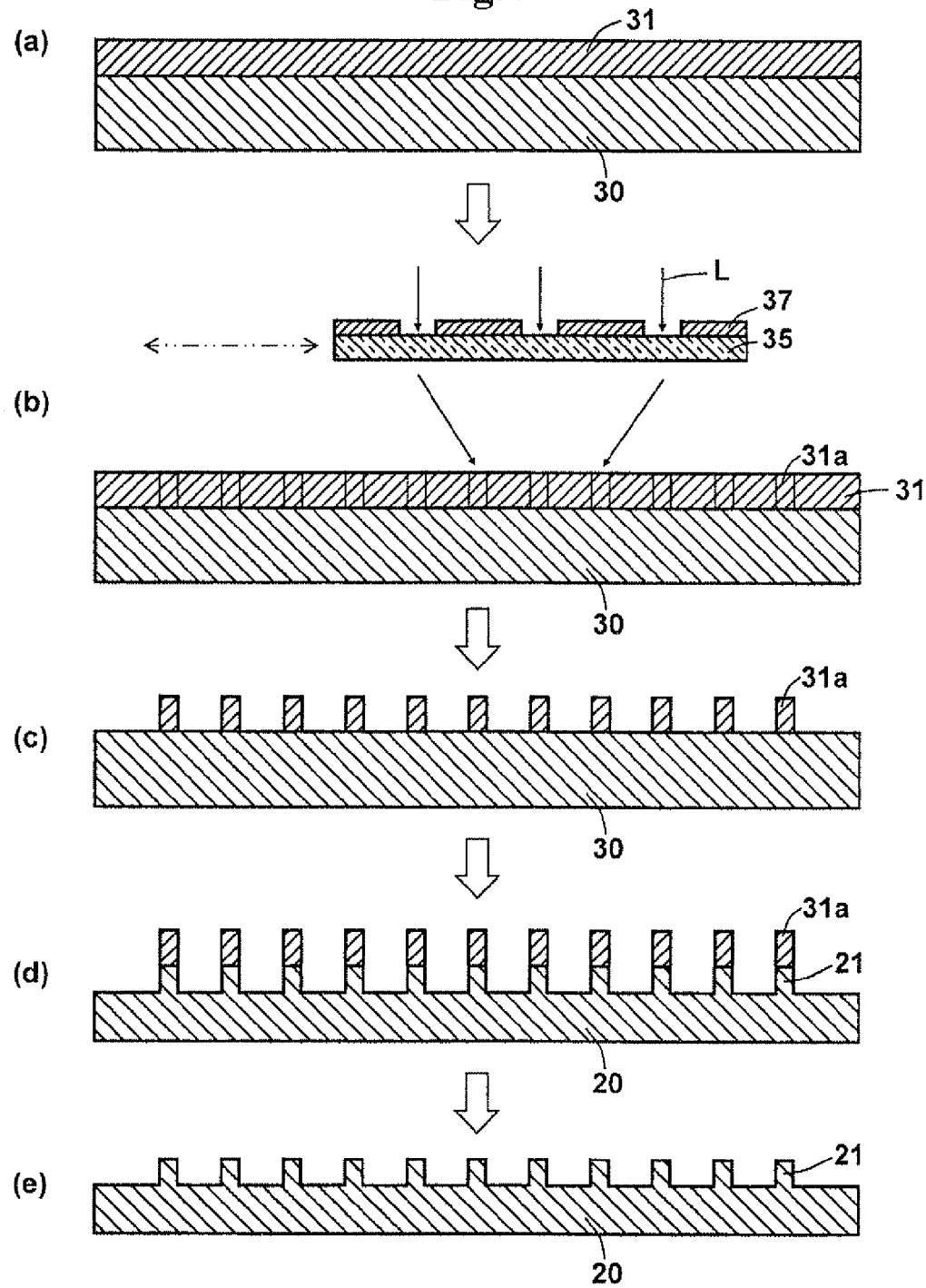
FIG. 4 is a schematic cross-sectional view showing a process for producing a film-forming substrate used for the process shown in FIG. 3.

As shown in FIG. 4(a), a resist film 31 is formed by applying a resist liquid on a flat surface of a substrate material 30 such as a 300 mmØ silicon wafer or quartz substrate etc., which is an original plate material for the film-forming substrate 20. As for the resist liquid, a publicly known resist liquid can be used.

Next, as shown in FIG. 4(b), the resist film 31 is exposed to light, through a previously formed photomask 35 having a mask pattern 37 which has a light transmissive portion corresponding to the convex portion 21, to exposure light L such as an ultraviolet light or laser beam appropriate for the resist liquid. As shown in the same Figure, as an example, the mask pattern 37 is formed on the photomask 35 in a size (for example, 4 times) larger than the pattern size to be exposed on the substrate material 30 and then at the time of exposure, the resist film 31 is irradiated with the exposure light L in a reduced size (1/4 times) using an optical lens (not shown).

And the photomask 35, as shown in the same Figure, is previously formed into a small plate size (for example, 150 mm-square) smaller than that of the substrate material 30, and the photomask 35 is sequentially moved so as to expose the resist film 31 to the light in a series sequentially from the edge thereof, thereby the entire surface of the resist film 31 is eventually exposed to the light. The resist film 31a is exposed to the exposure light L which has passed through the photomask 35.

Next, as shown in FIG. 4(c), the resist film 31 is developed to eliminate an unwanted portion and to leave the resist film 31a corresponding to the pattern of the convex portion 21.

Next, as shown in FIG. 4(d), the substrate material 30 is subjected to an etching process, and a portion other than a portion on which the resist film 31a is formed, is equally etched to form the convex portion 21.

Finally, as shown in FIG. 4(e), the resist film 31a is removed to complete the film-forming substrate 20. Thus, the film-forming substrate 20 with a plurality of minute convex portions 21 each having the same height can be manufactured easily and accurately.

In the above example, a negative type photomask 35 having a mask pattern 37 which has a portion to be eliminated during the etching process is described as the photomask 35. However, the convex portion 21 may be formed, using a positive type photomask having a mask pattern which has a portion to be left during the etching process.

The convex portion 21 may be formed on the surface of the substrate 30 using an electron beam lithography, ion beam lithography, X-ray lithography, abrasive blasting, spray coating in which a composition including fine particles having a diameter of nanometer order is sprayed, or printing process.

In the case where the pellicle film 2a is produced, the film-forming substrate having the convex portions 21 each arranged at a position corresponding to a position where the venting hole 7 is formed is produced as described above. And then the pellicle film 2a is produced using this film-forming substrate.

Example 1

A silicon wafer having the diameter of 300 mmØ was used as an original plate material for the film-forming substrate. A resist film was formed by coating the surface of the wafer with a resist liquid. Exposure was carried out at a reduction rate of 1/4 using a mask (150 mm-square) having holes measuring 0.4 μm in diameter formed all over the surface thereof. The mask was moved on the wafer so that the whole surface of the wafer was exposed to light. The resist was developed to leave the exposed portions. And then etching was carried out to form a concave-convex shape on the silicon wafer. Finally, the resist was removed and then the wafer was cleaned. Thus a substrate for pellicle film formation was prepared. The diameter of the convex portion on the wafer surface was 0.1 μm and the height of the step was 0.3 μm. The density of the convex portion was 0.5 $mm^2$ per 1 $mm^2$.

On the central portion of this film-forming substrate (silicon wafer), a 3% solution of "Cytop CTX-S" (produced by Asahi Glass Co., Ltd.) in perfluorotributylamine was dropped, and then the silicon wafer was rotated at the revolution of 760 rpm to spread the solution on the silicon wafer, thereby forming a coating film. The substrate was kept at a room temperature and then heated to 180° C. to form a pellicle film by evaporating the solvent. This film was peeled off from the silicon wafer surface to complete a pellicle film.

After the pellicle frame (the size of the outer shape: 149 mm×113 mm×4.5 mm, frame thickness: 2 mm) made of aluminum alloy was cleaned with pure water, an end face of the frame was coated with a silicone resin pressure-sensitive adhesion agent (X-40-3122 Trade name, produced by Shin-Etsu Chemical Co. Ltd.). Immediately after the coating, the pellicle frame was heated to 150° C. using an electromagnetic induction heating method. A surface opposite to the pressure-sensitive adhesion surface of the pellicle frame was coated with a 6% solution of "Cytop CTX-A" (produced by Asahi Glass Co., Ltd.) in perfluorotributylamine as an adhesive. After the coating, the pellicle frame was heated at 130° C. to harden the adhesive. And then, the above-mentioned pellicle film was attached to the adhesive side of the above-mentioned pellicle frame, and then a protruding portion of the pellicle film beyond the contour of the pellicle frame was removed to complete the pellicle of the present invention.

The pellicle film of the pellicle had the thickness of 0.28 μm and had holes (venting holes) of 0.1 μm in diameter all over the surface thereof with the hole density of 0.5 mm² per 1 mm².

This pellicle was attached to a mask and exposed to an ArF laser beam. No haze was seen on the mask after the irradiation of 10 kJ/cm².

Example 2

A silicon wafer having the diameter of 300 mmØ was used as an original plate material for the film-forming substrate. A resist film was formed by coating the surface of the wafer with the resist liquid. Exposure was carried out at the reduction rate of 1/4 using a mask (150 mm-square) having holes measuring 0.2 μm in diameter formed all over the surface thereof. The mask was moved on the wafer so that the whole surface of the wafer was exposed to light. The resist was developed to leave the exposed portion. And then etching was carried out to form a concave-convex shape on the silicon wafer. Finally, the resist was removed, and then the wafer was cleaned. Thus a substrate for pellicle-film formation was prepared. The diameter of the convex portion on the wafer surface was 0.05 μm and the height of the step was 0.3 μm. The density of the convex portion was 0.01 mm² per 1 mm².

On the central portion of this film-forming substrate (silicon wafer), the 3% solution of "Cytop CTX-S" (produced by Asahi Glass Co., Ltd.) in perfluorotributylamine was dropped, and then the silicon wafer was rotated at the revolution of 760 rpm to spread the solution on the silicon wafer, thereby forming a coating film. The substrate was kept at a room temperature and then heated to 180° C. to form a pellicle film by evaporating the solvent. This film was peeled off from the silicon wafer surface to complete the pellicle film.

After a pellicle frame (the size of the outer shape: 149 mm×113 mm×4.5 mm, frame thickness: 2 mm) made of aluminum alloy was cleaned with pure water, an end face of the frame was coated with the silicone resin pressure-sensitive adhesion agent (X-40-3122 Trade name, produced by Shin-Etsu Chemical Co., Ltd.). Immediately after the coating, the pellicle frame was heated to 150° C. using the electromagnetic induction heating method. A surface opposite to the pressure-sensitive adhesion surface of the pellicle frame was coated with the 6% solution of "Cytop CTX-A" (produced by Asahi Glass Co., Ltd.) in perfluorotributylamine as an adhesive. After the coating, the pellicle frame was heated at 130° C. to harden the adhesive. And then, the above-mentioned pellicle film was attached to the adhesive side of the above-mentioned pellicle frame, and then a protruding portion of the pellicle film beyond the contour of the pellicle frame was removed to complete the pellicle of the present invention.

The pellicle film of the pellicle had the thickness of 0.28 μm and had holes of 0.05 μm in diameter all over the surface thereof with the hole density of 0.01 mm² per 1 mm². This pellicle was attached to a mask and exposed to the ArF laser beam. No haze was seen on the mask after the irradiation of 10 kJ/cm².

Example 3

A silicon wafer having the diameter of 300 mmØ was used as an original plate material for the film-forming substrate. A resist film was formed by coating the surface of the wafer with the resist liquid. Exposure was carried out at the reduction rate of 1/4 using a mask having holes measuring 0.4 μm in diameter formed all over the surface thereof. The mask was moved on the wafer so that a region other than the wafer's central portion (105 mm×69 mm) was exposed to light. The resist was developed to leave the exposed portion. And then etching was carried out to form a concave-convex shape on the silicon wafer. Finally, the resist was removed and then the wafer was cleaned. Thus a substrate for pellicle-film formation was prepared. The diameter of the convex portion on a wafer surface of the portion other than the wafer's central portion (105 mm×69 mm) was 0.1 μm, and the height of the step of the convex portion was 0.3 μm. The density of the convex portion was 0.5 mm² per 1 mm².

On the central portion of this film-forming substrate (silicon wafer), the 3% solution of "Cytop CTX-S" (produced by Asahi Glass Co., Ltd.) in perfluorotributylamine was dropped, and then the silicon wafer was rotated at the revolution of 760 rpm to spread the solution on the silicon wafer, thereby forming a coating film. The substrate was kept at a room temperature and then heated to 180° C. to form a pellicle film by evaporating the solvent. This pellicle film was peeled off from the silicon wafer surface to complete the pellicle film.

The pellicle film had the thickness of 0.28 μm and had holes of 0.1 μm in diameter all over a portion other than the wafer's central portion (105 mm×69 mm). The hole density was 0.5 mm² per 1 mm².

After a pellicle frame (the size of the outer shape: 149 mm×113 mm×4.5 mm, frame thickness: 2 mm) made of aluminum alloy was cleaned with pure water, an end face of the frame was coated with the silicone resin pressure-sensitive adhesion agent (X-40-3122 Trade name, produced by Shin-Etsu Chemical Co., Ltd.). Immediately after the coating, the pellicle frame was heated to 150° C. using the electromagnetic induction heating method. A surface opposite to the pressure-sensitive adhesion surface of the pellicle frame was coated with the 6% solution of "Cytop CTX-A" (produced by Asahi Glass Co., Ltd.) in perfluorotribytylamine as an adhesive. After the coating, the pellicle frame was heated at 130° C. to harden the adhesive.

And then, the above-mentioned pellicle film was attached to the adhesive side of the above-mentioned pellicle frame, and then a protruding portion of the pellicle film beyond the contour of the pellicle frame was removed to complete the pellicle of the present invention. At the time the pellicle film was attached, a portion of the pellicle film having the area of 105 mm×69 mm in which there was no hole, was aligned to be positioned at a region 20 mm away from each pellicle frame, and then the pellicle film was attached.

The pellicle film of this pellicle had the thickness of 0.28 μm and had holes of 0.1 μm in diameter in the region other than the central portion having the area of 105 mm×69 mm and in the region within 20 mm from each pellicle frame. The hole density was 0.5 mm² per 1 mm².

This pellicle was attached to the mask and exposed to the ArF laser beam. No haze was seen on the mask after the irradiation of 10 kJ/cm$^2$.

Example 4

A silicon wafer having the diameter of 300 mmØ was used as an original plate material for the film-forming substrate. A resist film was formed by coating the surface of the wafer with the resist liquid. Exposure was carried out at the reduction rate of 1/4 using a mask having holes measuring 0.4 µm in diameter formed all over the surface thereof. The mask was moved on the wafer so that a portion other than the wafer's central portion (135 mm×99 mm) was exposed to light. The resist was developed to leave only the exposed portion. And then etching was carried out to form concave-convex shape on the silicon wafer. Finally, the resist was removed and then the wafer was cleaned. Thus the substrate for pellicle-film formation was prepared. The diameter of the convex portion on the wafer surface in the region other than the wafer's central portion (135 mm×99 mm) was 0.1 µm and the height of the step of the convex portion was 0.3 µm. The density of the convex portion was 0.5 mm$^2$ per 1 mm$^2$.

On the central portion of this film-forming substrate (silicon wafer), the 3% solution of "Cytop CTX-S" (produced by Asahi Glass Co., Ltd.) in perfluorotributylamine was dropped, and then the silicon wafer was rotated at the revolution of 760 rpm to spread the solution on the silicon wafer, thereby forming a coating film. The substrate was kept at a room temperature and then heated to 180° C. to form a pellicle film by evaporating the solvent. This pellicle film was peeled off from the silicon wafer surface to complete the pellicle film. The pellicle film had the thickness of 0.28 µm and had holes of 0.1 µm in diameter in a portion other than the wafer's central portion (135 mm×99 mm). The hole density was 0.5 mm$^2$ per 1 mm$^2$.

After a pellicle frame (the size of the outer shape: 149 mm×113 mm×4.5 mm, frame thickness: 2 mm) made of aluminum alloy was cleaned with pure water, an end face of the frame was coated with the silicone resin pressure-sensitive adhesion agent (X-40-3122 Trade name, produced by Shin-Etsu Chemical Co. Ltd.). Immediately after the coating, the pellicle frame was heated to 150° C. using an electromagnetic induction heating method. A surface opposite to the pressure-sensitive adhesion surface of the pellicle frame was coated with the 6% solution of "Cytop CTX-A" (produced by Asahi Glass Co., Ltd.) in perfluorotribytylamine as an adhesive. After the coating, the pellicle frame was heated at 130° C. to harden the adhesive.

And then, the above-mentioned pellicle film was attached to the adhesive side of the above-mentioned pellicle frame, and then a protruding portion of the pellicle film beyond the contour of the pellicle frame was removed to complete the pellicle. At the time the pellicle film was attached, a portion of the pellicle film which had the area of 135 mm×99 mm in which there was no hole, was aligned to be positioned in a region 5 mm away from each pellicle frame and then the pellicle film was attached.

The pellicle film of this pellicle had the thickness of 0.28 µm and had holes of 0.1 µm in diameter in the region other than the central portion having the area of 135 mm×99 mm, and in the region within 5 mm from each pellicle frame. The hole density was 0.5 mm$^2$ per 1 mm$^2$.

This pellicle was attached to the mask and exposed to the ArF laser beam. No haze was seen on the mask after the irradiation of 10 kJ/cm$^2$.

Example 5

A silicon wafer having the diameter of 300 mmØ was used as an original plate material for the film-forming substrate. A resist film was formed by coating the surface of the wafer with the resist liquid. Exposure was carried out at the reduction rate of 1/4 using a mask having holes measuring 0.4 µm in diameter formed all over the surface thereof. The mask was moved on the wafer so that a portion other than the wafer's central portion (105 mm×109 mm) was exposed to light.

The resist was developed to leave the exposed portion. And then etching was carried out to form concave-convex shape in the silicon wafer. Finally, the resist was removed and then the wafer was cleaned. Thus the substrate for pellicle-film formation was prepared. The diameter of the convex portion on the wafer surface in the portion other than the wafer's central portion (105 mm×109 mm) was 0.1 µm and the height of the step of the convex portion was 0.3 µm. The density of the convex portion was 0.5 mm$^2$ per 1 mm$^2$.

On the central portion of this film-forming substrate (silicon wafer), the 3% solution of "Cytop CTX-S" (produced by Asahi Glass Co., Ltd.) in perfluorotributylamine was dropped, and then the silicon wafer was rotated at the revolution of 760 rpm to spread the solution on the silicon wafer, thereby forming a coating film. The substrate was kept at a room temperature and then heated to 180° C. to form a pellicle film by evaporating the solvent. This film was peeled off from the silicon wafer surface to complete the pellicle film. The pellicle film had the thickness of 0.28 µm and had holes of 0.1 µm in diameter in a portion other than the wafer central portion (105 mm×109 mm). The hole density was 0.5 mm$^2$ per 1 mm$^2$.

After a pellicle frame (the size of the outer shape: 149 mm×113 mm×4.5 mm, frame thickness: 2 mm) made of aluminum alloy was cleaned with pure water, an end face of the frame was coated with the silicone resin pressure-sensitive adhesion agent (X-40-3122 Trade name, produced by Shin-Etsu Chemical Co., Ltd.). Immediately after the coating, the pellicle frame was heated to 150° C. using the electromagnetic induction heating method. A surface opposite to the pressure-sensitive adhesion surface of the pellicle frame was coated with the 6% solution of "Cytop CTX-A" (produced by Asahi Glass Co., Ltd.) in perfluorotributylamine as an adhesive. After the coating, the pellicle frame was heated at 130° C. to harden the adhesive.

And then, the above-mentioned pellicle film was attached to the adhesive side of the above-mentioned pellicle frame, and then a protruding portion of the pellicle film beyond the contour of the pellicle frame was removed to complete the pellicle. At the time the pellicle film was attached, the portion having the area of 105 mm×109 mm in which there was no hole was aligned to be positioned at a central portion of the pellicle frame so that the holes were in a region adjacent to and within 20 mm from both short sides of the pellicle frame, and then the pellicle frame was attached.

The pellicle film of this pellicle had the thickness of 0.28 µm and had holes of 0.1 µm in diameter in the region other than the central portion (105 mm×109 mm), or in the region adjacent to and within 20 mm from both short sides of the pellicle frame. The hole density was 0.5 mm$^2$ per 1 mm$^2$.

This pellicle was attached to the mask and exposed to the ArF laser beam. No haze was seen on the mask after the irradiation of 10 kJ/cm$^2$.

Comparative Example

A silicon wafer having the diameter of 300 mmØ was used as a film-forming substrate. On the central portion of the film-forming substrate (silicon wafer), the 3% solution of "Cytop CTX-S" (produced by Asahi Glass Co., Ltd.) in perfluorotributylamine was dropped, and then the silicon wafer was rotated at the revolution of 760 rpm to spread the solution on the silicon wafer, to thereby form a coating film. The substrate was kept at a room temperature and then heated to 180° C. to form a pellicle film by evaporating the solvent, this pellicle film was peeled off from the silicon wafer surface to complete the pellicle film.

After a pellicle frame (the size of the outer shape: 149 mm×113 mm×4.5 mm, frame thickness: 2 mm) made of aluminum alloy was cleaned with pure water, an end face of the frame was coated with the silicone resin pressure-sensitive adhesion agent (X-40-3122 Trade name, produced by Shinetsu Kagaku Kabushuki Kaisha). Immediately after the coating, the pellicle frame was heated to 150° C. using electromagnetic induction heating method. A surface opposite to the pressure-sensitive adhesion surface of the pellicle frame was coated with the 6% solution of "Cytop CTX-A" (produced by Asahi Glass Co., Ltd.) in perfluorotributylamine as an adhesive. After the coating, the pellicle frame was heated at 130° C. to harden the adhesive.

And then, the adhesive side of the above-mentioned pellicle frame was attached to the above-mentioned pellicle film, and then a protruding portion of the pellicle film beyond the contour of the pellicle frame was removed to complete the pellicle.

The thickness of the pellicle film was 0.28 μm.

The pellicle was attached to a mask and exposed to the ArF laser beam, generation of a haze was seen on the mask after the irradiation of 10 kJ/cm².

What is claimed is:

1. A pellicle for lithography comprising a frame-like pellicle frame having a central opening and one frame face on one side of the pellicle frame and another frame face on the other side of the pellicle frame; and
    a laser beam transmissive pellicle film for lithography, which is attached to the one side of the pellicle frame faces,
    wherein the other open frame face is capable of attaching to a photomask and the pellicle film has a venting hole having a hole size through which a gas can pass but not a solid particle.

2. The pellicle for lithography according to claim 1, wherein the venting hole has a hole size of up to 0.1 μm in diameter.

3. The pellicle for lithography according to claim 2, wherein the pellicle film has a hole density in the range of 0.01 mm²-0.5 mm² per 1 mm² of a gas passage region in which the venting holes are formed.

4. The pellicle for lithography according to claim 1, wherein the pellicle film has a plurality of said venting holes all over a laser beam transmissive region through which said laser beam passes.

5. The pellicle film for lithography according to claim 1, wherein the pellicle film has a plurality of said venting holes in a frame side region of the laser beam transmissive region, the frame side region being formed along an inside wall of said pellicle frame.

6. The pellicle for lithography according to claim 5, wherein the frame side region is formed within 20 mm from the inside wall of said pellicle frame.

7. The pellicle for lithography according to claim 5, wherein the frame side region does not oppose to a mask pattern region on said photomask.

8. A method for manufacturing a pellicle film having a venting hole through which a gas passes but not a solid particle, comprising the steps of:
    preparing a film-forming substrate having a surface on which a convex portion that fits into the venting hole is provided;
    dropping a solution of a pellicle film composition, comprising a pellicle film material and a volatile solvent, on a central portion of the film-forming substrate;
    rotating the film-forming substrate so as to apply, under a centrifugal force, the solution all over the surface of the film-forming substrate to have a thickness of the same dimension as that of a height of the convex portion;
    evaporating the volatile solvent to form the pellicle film; and
    removing the pellicle film from the film-forming substrate.

* * * * *